(12) United States Patent
Odhiambo et al.

(10) Patent No.: US 10,990,531 B2
(45) Date of Patent: Apr. 27, 2021

(54) CLOUD-BASED FREQUENCY-BASED CACHE MANAGEMENT

(71) Applicant: Intel Corporation, Santa Clara, CA (US)

(72) Inventors: Fredrick Odhiambo, Swindon (GB); Maximillan Domeika, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 16/553,668

(22) Filed: Aug. 28, 2019

(65) Prior Publication Data

US 2020/0201768 A1 Jun. 25, 2020

(51) Int. Cl.
| G06F 12/00 | (2006.01) |
| G06F 12/0862 | (2016.01) |
| G06F 8/61 | (2018.01) |
| G06F 16/9535 | (2019.01) |
| G11C 11/409 | (2006.01) |
| G06F 11/30 | (2006.01) |
| G06F 16/9538 | (2019.01) |

(52) U.S. Cl.
CPC ............ *G06F 12/0862* (2013.01); *G06F 8/61* (2013.01); *G06F 11/3037* (2013.01); *G06F 16/9535* (2019.01); *G06F 16/9538* (2019.01); *G11C 11/409* (2013.01); *G06F 2212/6026* (2013.01)

(58) Field of Classification Search
CPC .. G06F 12/0862; G06F 12/0866; G06F 12/08; G06F 16/9535; G06F 16/9538; G06F 8/61; G06F 11/3037; G06F 2212/6026; G11C 11/409
See application file for complete search history.

(56) References Cited

U.S. PATENT DOCUMENTS

2002/0083183 A1* 6/2002 Pujare ................... H04L 67/16
709/231

* cited by examiner

*Primary Examiner* — Shawn X Gu
(74) *Attorney, Agent, or Firm* — Jordan IP Law, LLC

(57) ABSTRACT

Systems, apparatuses and methods may provide for technology that in response to one or more of an installation of an application or a modification to the application, generates a lookup key based on a first file that is associated with the application, determines that the lookup key is to be transmitted to a server, and determines whether to store at least a portion of the first file in a memory cache based on a first frequency indicator associated with the first file from the server.

25 Claims, 11 Drawing Sheets

CLOUD-BASED FREQUENCY-BASED CACHE MANAGEMENT

TECHNICAL FIELD

Embodiments generally relate to cache management, and particularly to cache management based on crowd-sourced data intelligence and data analytics.

BACKGROUND

When an application is launched for the first time on a system with a cache (e.g., a disk cache, memory cache, a persistent disk cache, etc.), the cache may not contain data associated with the application. Similarly, when the application is updated, the cache may not include the most used data of the application. Thus, the application may initially have suboptimal cache usage. For example, caching may only occur after the application is utilized after an application installation or update. The cache replacement policies may be enhanced slowly and over time as the application's disk access patterns are measured and cached in balance with other applications executing on the system. Adjusting the cache replacement policies in such a fashion may result in suboptimal performance for extended periods of time (e.g., several days or weeks) as optimal cache replacement polices are achieved to impact user experience and performance. Furthermore, applications have evolved over time to become more frequently updated than in the past. Thus, modern applications may be prone to suffering from suboptimal cache usage at an ever increasing rate due to nearly continuous application updates.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1A:
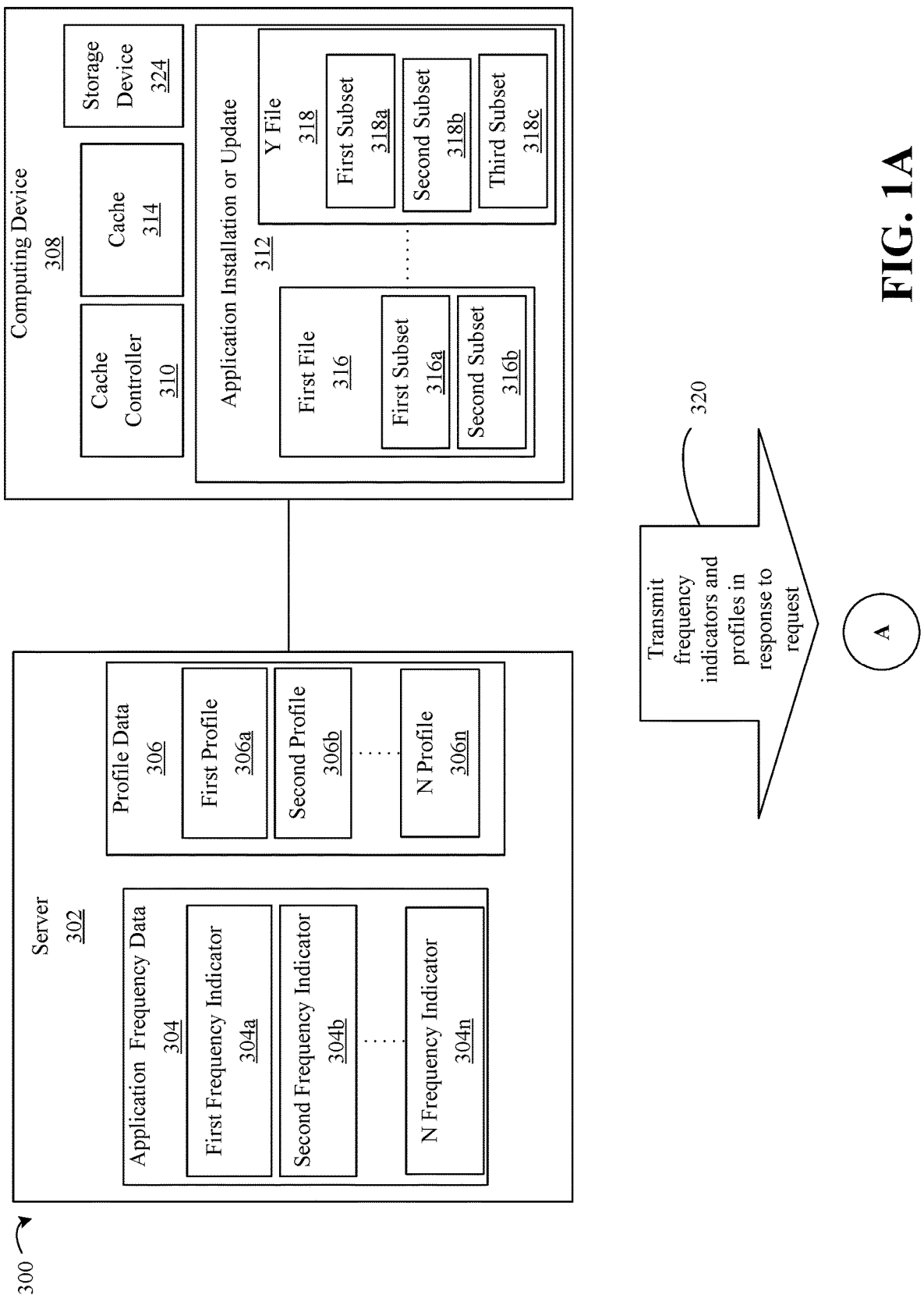
FIGS. 1A, 1B and 1C are an example of a process to enhance cache replacement policies according to an embodiment.

Turning now to FIG. 1, a process 300 to enhance cache replacement policies (e.g., data prefetch and data replacement) is illustrated. As will be explained in further detail below, a cache controller 310 may interact with the server 302 to access crowd-sourced data to generate the enhanced cache replacement policies prior to a first execution of an application after the application is modified or installed through the application installation or update 312. That is, files of the application may be prioritized prior to the first execution of the application on the computing device 308 to determine which files are stored in cache 314 (e.g., 3d Xpoint, disk caches, etc.). The cache replacement policies may be based on crowd-sourced intelligence on data associated with the application. The cache replacement policies may further limit a number rewrites to cache 314 to avoid degradation of cache 314, while facilitating low-latency execution of the application. In some embodiments, a user of the computing device 308 may be categorized (using artificial intelligence) into a category (e.g., uses photo features of application), and the cache replacement policies may be determined based on the category. Thus, the cache controller 314 may generate enhanced cache replacement policies that are refined and adjusted based on the user, as well as the cache 314.

By enhancing the cache replacement policies as described above, the user may have a more favorable impression of the application. For example, the user may already have the most relevant cached data in the cache 314 to reduce latency of execution of the application. Moreover, excessive degradation of the cache 314 may be avoided to increase the life, longevity and capacity of the cache 314 by avoiding writing data to the cache 314 that is frequently rewritten.

A server 302 may store application frequency data 304 and profile data 306. The server 302 may generate the application frequency data 304 and the profile data 306 from usage data of a broad spectrum of users. A user device may be a computing device 308 that is connected to the server 302. The computing device 308 may be connected to the server 302 through the internet or other connection. The computing device 308 may include an application installation or update 312 that will cause an application to be installed or updated. The application installation or update 312 includes first file 316 to Y file 318 that are to be installed and/or modified on the computing device 308. It will be understood that the application installation or update may include any number of files.

As will be discussed in further detail below, the cache controller 310 may access and/or communicate with the server 302 to institute a cache replacement scheme that is enhanced based on usage patterns and frequency metrics of other users of the application. For example, the server 302 may store application frequency data 304. The application frequency data 304 records frequency metrics (e.g., how many times data is accessed, how long before data is written over, how many times data is rewritten etc.) associated with the execution of the application on other user devices of the other users. The profile data 306 may identify correlations in usage patterns (e.g., types of application used, how applications are utilized, etc.) and data usage (e.g., data that is likely to be accessed) to predict, based on historical usage patterns of the user of the computing device 308, which data is likely to be frequently accessed and/or temporal lifetimes of data. The cache controller 310 may access the application frequency data 304 and the profile data 306 to determine cache replacement policies.

Furthermore, in some embodiments, the cache controller 310 may employ a cache replacement policy that may exclude frequently rewritten data from being stored in the cache 314. For example, frequent rewrites (which correspond to a temporal lifetime as described herein) to the cache 314 may result in a diminished lifetime or performance of the cache 314. That is, memory portions of the cache 314 may only be able to be written to a predetermined number of times before the memory portions fail or may no longer be utilized. Thus, an amount of usable memory of the cache 314 may decrease if some memory portions of the cache 314 are frequently written to and/or the life of the cache 314 may decrease. If application frequency data 304 identifies data as being frequently rewritten, the cache controller 310 may avoid writing such data into the cache 314. Doing so may prolong the life of cache 314 and increase the useable amount of the cache 314 throughout the life of the cache 314.

As will be discussed in further detail below, an artificial intelligence (AI) operation of the server 302 may analyze usage data to determine classes of users that have similar usage patterns and store the classes in the profile data 306. The AI operation may converge towards a solution that includes identification and/or categorization of a user based on factors (e.g., application(s) usage or user queries), and generate based on the identification and/or categorization an optimal data caching scheme that is customized for the user. For example, the AI operation may determine that a photography category of users (e.g., users of first, second and third applications) will typically use other applications in a manner that will utilize imaging data of the other applications but not photocopying data of the other applications. Thus, the AI operation may generate a new profile that includes scaling factors (or access counts) to prioritize the imaging data over the photocopying data of the other applications when the user is identified as falling in the photography category (e.g., first, second and third applications are installed on a user device, user indicates interest in photography, user is identified as accessing photography web sites, etc.) and that the other applications pertain to photography. The new profile may be stored in the profile data 306. The cache controller 310 may access the new profile data in the profile data 306 as appropriate and as described to determine which data to cache. Thus, if the application associated with the application installation or update 312 includes imaging data, the cache controller 310 may reference the new profile data to prioritize the imaging data over other data of the application to store the imaging data in the cache 314. Doing so may further enhance the cache replacement policies since appropriate data may be stored in the cache 314 based on caching patterns of users that are similar to a current user.

The cache controller 310 may access the application frequency data 304 and the profile data 306 to determine a cache replacement scheme that is targeted at the user of the computing device 308. As such, directly after modification or installation, the application may enjoy the benefits of a refined and enhanced cache replacement scheme. Doing so may result in a near immediate enhanced application performance by employing a cache replacement policy that avoids high-latency accesses to storage device 324 and beneficial low-latency accesses to the cache 314. That is, the application and the computing device 308 may perform at enhanced latencies and at reduced power when the application is first executed after a new disk cache installation, when the application is first installed, and the application is updated.

For example, in some embodiments the cache controller 310 may access the application frequency data 304 to identify the frequency metrics. The cache controller 310 may scale aspects (e.g., total number of accesses, lifetime metrics that indicate how many times data is rewritten, etc.) of the frequency metrics based on the profile data 306. The cache controller 310 may then analyze the scaled frequency metrics to determine which data of the application installation or update 312 to store in the cache 314. For example, the cache controller 310 may generate from the scaled frequency metrics, a ranked list of data that is to be installed and/or updated in order from most frequently accessed to least frequently accessed, and store the most frequently accessed data in the cache 314.

Moreover, in some embodiments, the cache controller 310 may employ a cache replacement policy that may be based on a type of the cache 314. For example, the cache controller 310 may determine the type of the cache 314, and generate a cache replacement policy based on data from the application frequency data 304 that is associated with the type of the cache 314. Further, the cache controller 310 may ignore data from the application frequency data 304 that is not associated with the type of the cache 314.

In some embodiments, the cache controller 310 may modify the cache replacement policy based on a performance metric of the cache 314. For example, the performance metric may indicate how many writes the cache 314 may withstand before performance of the cache begins to degrade. For example, if frequent rewrites will degrade the cache 314, the cache controller 310 may determine that the cache replacement policy should decrease a priority of frequently rewritten data from being stored in the cache 314 to reduce the probability of such data being stored in the cache 314. In contrast, if frequent rewrites will not degrade the cache 314, the cache controller 310 may determine that the cache replacement policy should not decrease a priority of frequently rewritten data from being stored in the cache 314 to not affect the probability of such data being stored in the cache 314.

The performance metric may be used as described as above to exclude frequently rewritten data from being stored in the cache 314. For example, suppose that the performance metric indicates that frequent rewrites (e.g., a short temporal lifetime) to the cache 314 will degrade the cache 314. The cache controller 310 may set a low frequency threshold based on the performance metric. As discussed above, the profile data 306 may include a frequency of rewrites of data of the application. The cache controller 310 may determine whether the frequency of rewrites meets the low frequency threshold, and exclude the data from being stored in the cache 310 if so. Otherwise, the cache controller 310 may store the data in the cache 314.

The application frequency data 304 may be a database that includes first frequency indicator 304a-N frequency indicator 304n that describe the frequency metrics from other user devices. The application frequency data 304 may be a crowd-sourced data intelligence repository that may be used to update cache (e.g., a persistent memory-based disk and/or the high-speed disk cache) of an end user system. The frequency data 302 may be gathered from all consenting users that employ a cache and based upon the unique file access patterns of the users. The server 302 may utilize join operations at a cloud level to merge and prioritize caching decisions into the application frequency data 304. Each user device of the users may also employ join operations to identify the file access patterns unique to the user of the user device.

For example, the server 302 may generate the first frequency indicator 304a-N frequency indicator 304n based on data usage patterns of other users. The other users may utilize the application and the usage patterns may indicate which portions of the application are typically cached and under which circumstances. For example, the first frequency indicator 304a may correspond to a first file of the application. The first frequency indicator 304a may include a lookup key (e.g., anonymized multibyte checksum or cyclic redundancy check) generated based on contents of the first file, an identification of the first file, blocks (e.g., subsets) of the first file, access counts of the first file and the blocks and/or timestamps of the first file and the blocks. The subsets may be different from each other. The access counts and timestamps may be determined from usage patterns of the other users. For example, the server 302 may receive the access counts and the timestamps from the computing devices of the other users and store the access counts and the timestamps in the first frequency indicator 304. It is worth noting that each block may have a different access count and timestamp to enable the cache controller 310 to execute a granular data performance analysis.

Furthermore, the second frequency indicator 304b may correspond to a second file of the application. The second frequency indicator 304b may include a lookup key generated based on the second file, an identification of the second file, blocks (e.g., subsets) of the second file, access counts of the second file and the blocks and/or timestamps of the second file and the blocks. As described above, the server 302 may determine the data of the second frequency indicator 304b from other users. Similarly, other frequency indicators associated with the application, including the N frequency indicator 304n, may be determined and stored in the application frequency data 304.

Thus, each of the first frequency indicator 304a-N frequency indicator 304n may be associated with a different file of the application, and include a lookup key generated from a respective file of the application, a file identification of the respective file of the application, subsets (e.g., blocks) of the respective file, an access count to the respective file and access counts to the subsets and/or timestamps. Each of the first frequency indicator 304a-N frequency indicator 304n may correspond to a different file of the application. In some embodiments, the application frequency data 304 may include frequency indicators associated with other applications.

In some embodiments, each of the frequency indicator 304a-N frequency indicator 304n may include frequency tuples that each correspond to a different respective subset. The frequency tuples account for two specific types of access: 1) the number of times the data of the respective subset was accessed and 2) the temporal lifetime of the respective subset (e.g., the relative time before the data of the respective is rewritten).

In some embodiments, any of the lookup keys referenced herein is generated through a hardware-based accelerator. Doing so may ensure security and reduce latencies.

The server 302 may determine correlations (e.g., correlations across different applications or categories of users), and scaling factors through AI operations. If the cache controller 310 determines that the correlation is met, the scaling factors may be applied. The profile data 306 may include first profile-N profile 306a-306n. The cache controller 310 may access the first profile-N profile 306a-306n to determine scaling factors to increase or decrease the influence of the one or more of the first frequency indicator 304a-N frequency indicator 304n. For example, the cache controller 310 may determine whether usage patterns of the user correspond to one or more profiles of the first profile-N profile 306a-306n. If so, the cache controller 310 may read the scaling factors from the one or more profiles, and scale one or more of the first frequency indicator 304a-N frequency indicator 304n based on the scaling factors.

The scaling factors may be applied against the first frequency indicator 304a-N frequency indicator 304n to increase and/or decrease the probability of files and subsets of the files being loaded into the cache 314. For example, suppose that the second frequency indicator 304b includes a number of access counts "X" to a second file, a number of access counts "Y" to a first subset of the second file, and a number of access counts "Z" to a second subset of the second file. Further suppose that the first profile 306a is applicable and indicates that the second frequency indicator 304b should be modified based on a scaling factor (e.g., multiplied by 0.8) to reduce a probability that the first file, the first subset and the second subset will be loaded into the cache 314. Then each of the access counts X, Y and Z may be multiplied by the scaling factor. In some embodiments, the first profile 306a may indicate that different scaling factors are to be applied to access counts X, Y and Z (e.g., multiply X by 1, Y by 0.5 and Z by 1.5). Thus, the cache controller 310 may apply different scaling factors to access counts of the first-N frequency indicators 304a-304n based on one or more of the first-N profiles 306a-306n.

In some embodiments, each of the first profile 306a-N profile 306n, includes predetermined access counts and/or lifetimes. In such embodiments, if a match is detected between the usage patterns of the user and one profile of the first profile 306a-N profile 306n, the predetermined access counts and/or lifetimes may override access counts and/or lifetimes of the application frequency data 304 that pertain to the same data of the application installation or update 312. For example, suppose a match is detected between the usage patterns and the first profile 306a, and further that the first frequency indicator 306a is applicable. The access counts of the first profile and the access counts of the first frequency indicator 304a may further pertain to the same data of the application installation or update 312. To determine whether to cache the same data, the cache controller 310 may utilize access counts of the first profile and avoid utilization of the access counts of the first frequency indicator 304a.

In some embodiments, the server 302 may employ AI operations to analyze usage patterns and determine that if a first cache replacement policy (associated with a first set of scaling factors) is utilized for executing a first application, it is probable that a second cache replacement policy (associated with a second set of scaling factors) will be employed for a second application. Thus, a correlation may be established between the first and second applications to determine whether to utilize the first or second set of scaling factors. It is worth noting that the first and second scaling factors may be the similar or the same.

The correlation between the first and second applications, the first and second cache replacement policies and the first and second sets of scaling factors may be stored in the first profile data 306a. In the present example, the cache controller 310 may determine that the application update and/or installation 312 is for the second application. The computing device 308 may then access the profile data 306 to identify that the first profile data 306a references a correlation between the first application and the second application. The cache controller 310 may then determine whether the user has utilized the first application. If so, the cache controller 310 may read the second set of scaling factors and utilize the second set of scaling factors to scale one or more of the first frequency indicator-N frequency indicator 304a-304n. If however the user has never used the first application, the correlation is not met and so the cache controller 310 does not utilize the second set of scaling factors.

The AI operation of the server 302 may analyze usage data to determine classes of users that have similar usage patterns to generate categories of users. The AI operation may converge towards a solution that includes identification and/or categorization of a user based on factors (e.g., application(s) usage or user queries), and generate based on the identification and/or categorization an optimal data caching scheme that is customized for the user.

The process 300 may include a transmission of the first frequency indicator 304*a*-N frequency indicator 304*n* as well as the first profile-N profile 306*a*-306*n* in response to a request 320 from the computing device 320. In some embodiments, the cache controller 310 may generate an anonymous lookup parameter (e.g., a lookup key) that the server 302 references against the first frequency indicator 304*a*-N frequency indicator 304*n* to determine whether the first frequency indicator 304*a*-N frequency indicator 304*n* are applicable. For example, the cache controller 310 may generate a first lookup key (e.g., anonymized multibyte checksum or cyclic redundancy check) based on the first file 316, and a second lookup key (e.g., anonymized multibyte checksum or cyclic redundancy check) based on the Y file 318. Similarly, the cache controller 310 may generate other lookup keys for all the files of the application installation or update 312.

The first lookup key, the second lookup key and the other lookup keys may collectively be referred to as application lookup keys for brevity. The server 302 may receive the application lookup keys as part of the request and compare the application lookup keys to the lookup keys of the first frequency indicator 304*a*-N frequency indicator 304*n*. If a match is found between one of the application lookup keys and a lookup key of one of the frequency indicators of the first frequency indicator 304*a*-N frequency indicator 304*n*, the one frequency indicator is transmitted to the computing device 308. As already described above, the server 302 may also identify one or more of profiles of the first-N profiles 306*a*-306*n* that matches a correlation or category, and transmit the one or more profiles to the computing device 308.

Figure 1B:
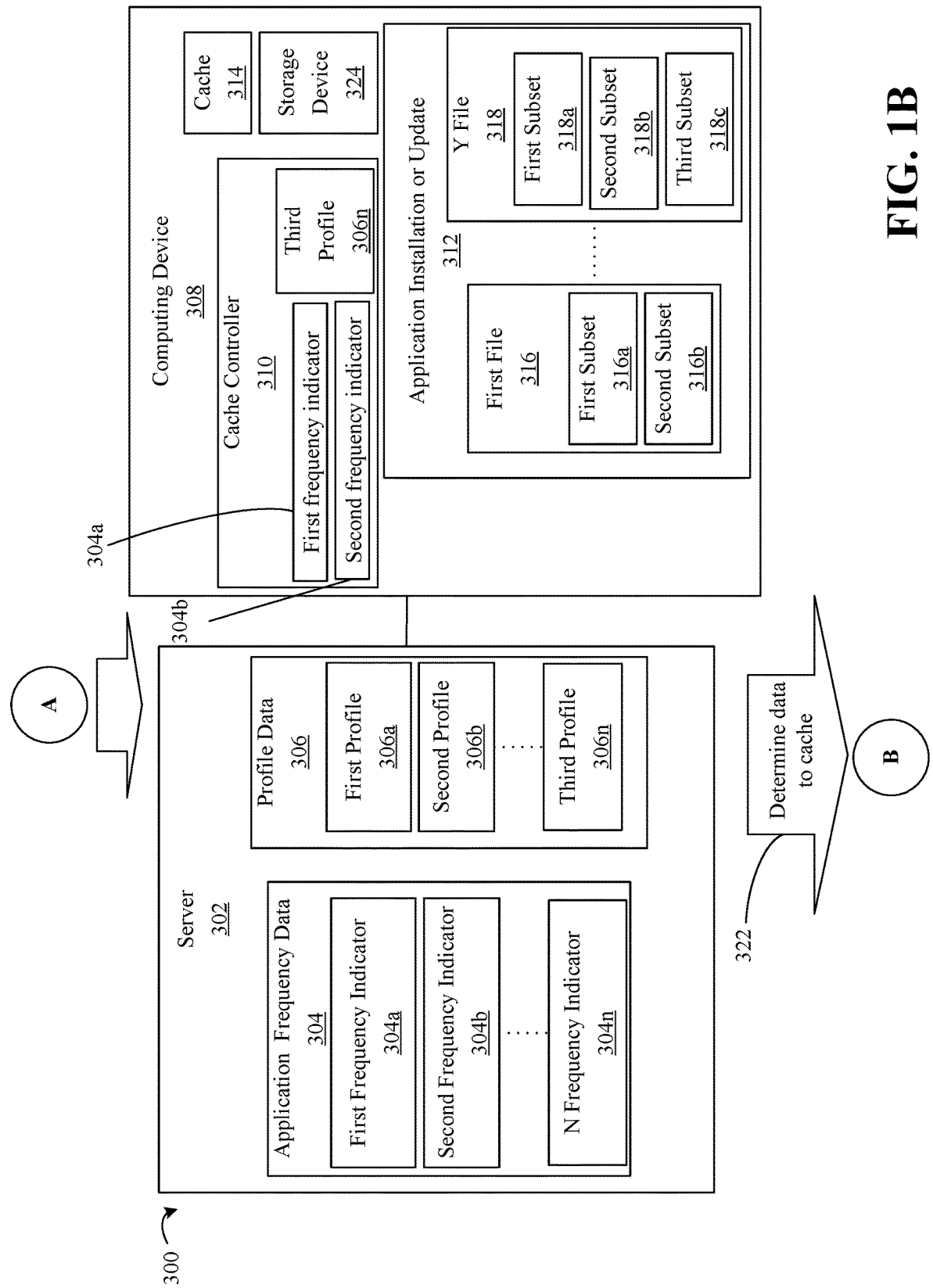

As illustrated in FIG. 1B, the server 302 identifies that lookup keys of the first frequency indicator 304*a* and the second frequency indicator 304*b* respectively match a lookup key of the first file 316 and a lookup key of the Y file 318. Thus, the first frequency indicator 304*a* and the second frequency indicator 304*b* are transmitted to and stored by the cache controller 310. Further, the server 302 determines that the third profile 306*n* is applicable as well due to a match between the third profile 306*n* and usage patterns of the user of the computing device 308.

As is illustrated, the first file 316 is divided into two subsets including first subset 316*a* and second subset 316*b* that may be different portions of computer code of the first file 316. The Y file is divided into a first subset 318*a*, second subset 318*b* and third subset 318*c* that may be different portions of computer code of the Y file 318.

The process 300 may include determining which data to cache 322. For example, the cache controller 310 may identify, based on the first frequency indicator 304*a*, a first file access count and first file temporal lifetime of the first file 316, a first subset access count and first subset temporal lifetime of the first subset 316*a* and a second subset access count and second subset temporal lifetime of the second subset 316*b*. The cache controller 310 may adjust the first file access count, the first file temporal lifetime, the first subset access count, the first subset temporal lifetime, the second subset access count and the second subset temporal lifetime based on scaling factors of the third profile 306*n*.

Similarly, the cache controller 310 may determine and adjust temporal lifetimes and access counts of the Y file 318, first subset 318*a*, second subset 318*b* and third subset 318*c*. The cache controller 310 may determine that data that is accessed more frequently than other data is to be stored in the cache 314. If however the more frequently accessed data is often times written to, the cache controller 310 may avoid writing such frequently accessed data to the cache 314 to avoid degradation of the cache 314 as described above.

In some embodiments, the cache controller 310 may generate a file ranking list arranged in order of most access count to least access count, and a list of top subsets arranged in order of most access counts to least access counts. The cache controller 310 may reference the file ranking list and the list of top subsets to determine which data to place in cache 314. For example, the cache controller 310 may determine that first file 316 and Y file 318 are accessed most frequently out of all files of the application installation or update 312.

Figure 1C:
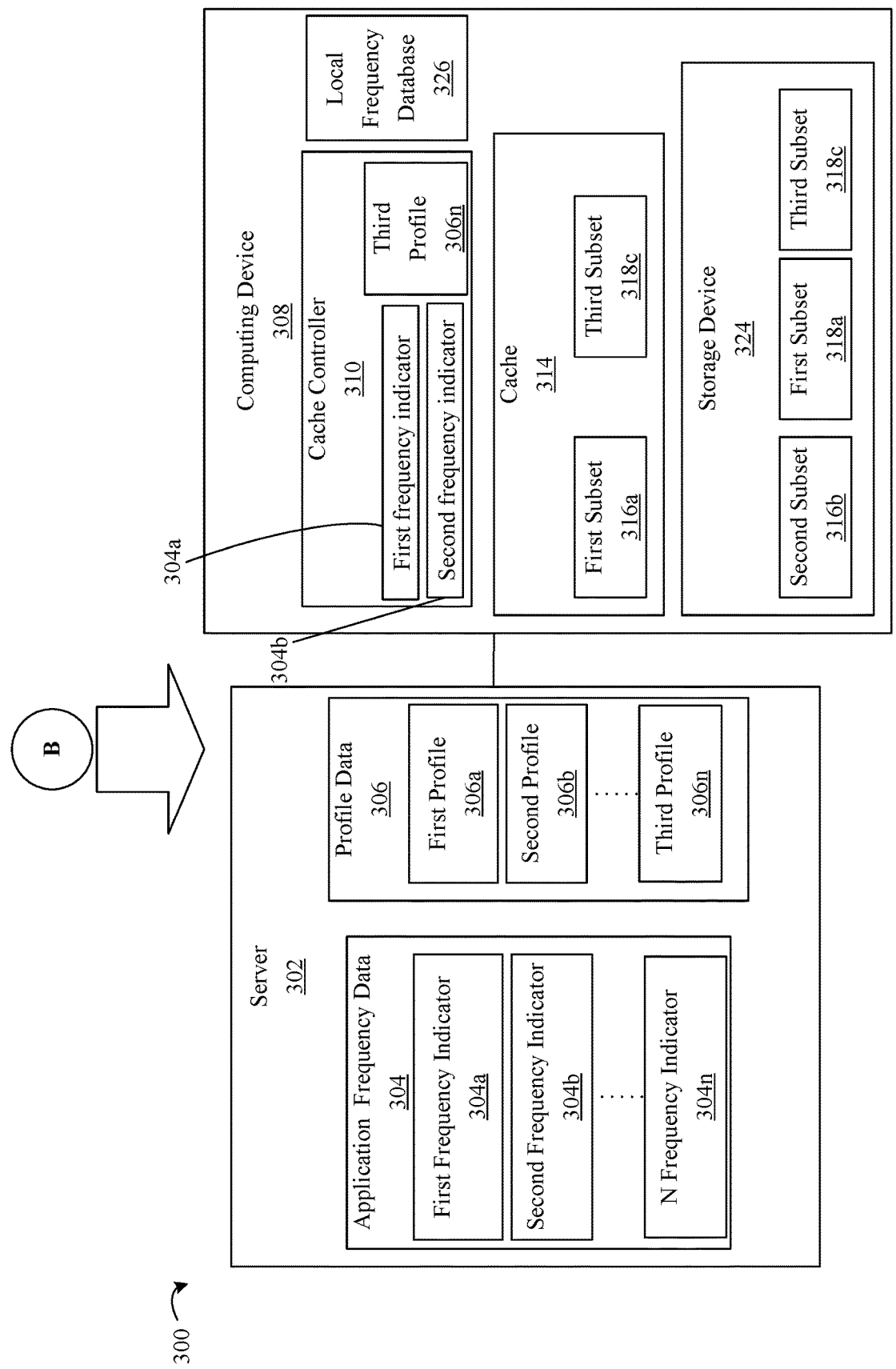

As illustrated in FIG. 1C, the cache controller 310 may then determine that the first subset 316*a* is the most frequently accessed subset out of the first subset 316*a* and second subset 316*b*, and that the third subset 318*c* is the most frequently accessed subset out of the first-third subsets 318*a*-318*c*. The cache controller 310 may further determine that the temporal lifetimes of the first subset 316*a* and the third subset 318*c* are within acceptable boundaries (e.g., a frequency of rewrites is acceptable) and cause the first subset 316*a* and the third subset 318*c* to be stored in the cache 318. In contrast, the second subset 316*b* of the first file 316, and the first and second subsets 318*a*, 318*b* of the Y file 318 are stored in the storage device 324. The cache controller 310 may continue to store and reference the first frequency indicator 304*a*, the second frequency indicator 304*b* and the third profile 306*n* during use of the application.

In some embodiments, the computing device 308 may further generate a local frequency database 326 to record of a temporal lifetime of data that is stored in the cache 314, a number of accesses to files and a number of accesses to subsets of the files. The computing device 308 may periodically upload the local frequency database 326 to the server 302. The computing device 308 may record data pertaining to a plurality of different applications in the local frequency database 326. In some embodiments, the local frequency database 326 includes averages of accesses.

In some embodiments, the computing device 308 may employ a hardware-based memory encryption on the local frequency database 326 to ensure security and anonymity. For example, the hardware-based memory encryption process may encrypt the local frequency database 326 prior to transmission to the server 302 so that the encrypted local frequency database 326 is transmitted to the server 302. The server 302 may then decrypt the local frequency database 326.

Thus, in some embodiments, the cache controller 310 may track usage (e.g., access counts of files and subsets) of the application and send the usage to the server 302. Prior to doing so however, the cache controller 310 may anonymize the usage data by removing any personal details from the usage data.

Figure 2:
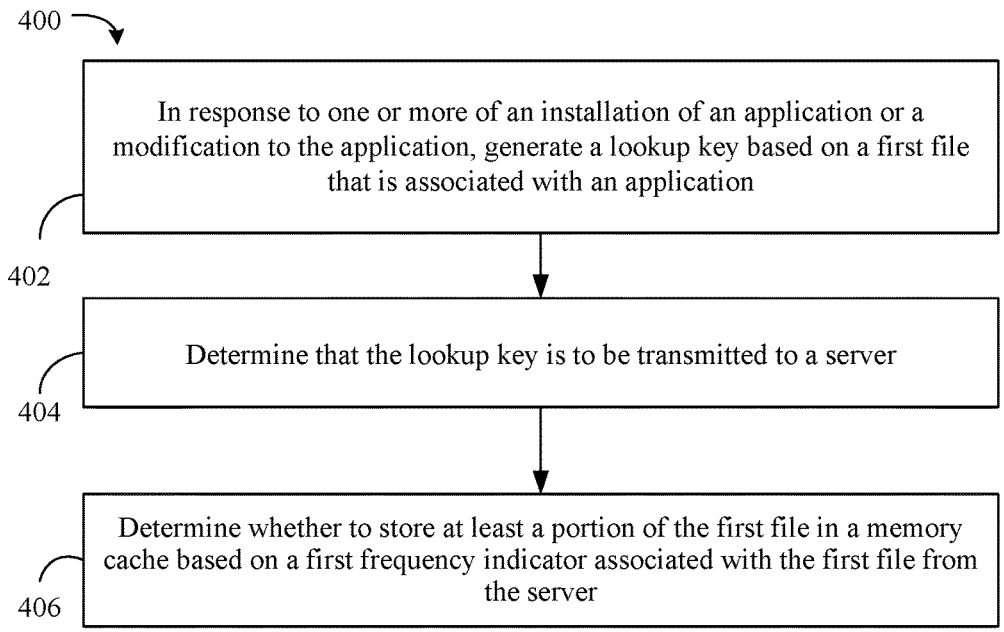
FIG. 2 is a flowchart of an example of a method of crowd-sourced data intelligence cache management according to an embodiment.

FIG. 2 shows a method 400 of crowd-sourced data intelligence cache management. The method 400 may generally be implemented in the process 300, already discussed. In an embodiment, the method 400 is implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 400 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 402 in response to one or more of an installation of an application or a modification to the application, generates a lookup key based on a first file that is associated with an application. Illustrated processing block 404 determines that the lookup key is to be transmitted to a server. Illustrated processing block 406 determines whether to store at least a portion of the first file in a memory cache based on a first frequency indicator associated with the first file from the server.

In some embodiments, processing block 406 further includes receiving a plurality of frequency indicators associated with a plurality of files associated with the application. In such embodiments, processing block 406 includes generating a ranked list of the plurality of files and the first file based on the plurality of frequency indicators and the first frequency indicator, and determining whether to store the at least the portion of the first file in the memory cache based on the ranked list.

In some embodiments, method 400 may further include identifying a first profile for a user based on usage patterns of the user. For example, a plurality of profiles may be accessed that are associated with different users. The first profile is identified from the plurality of profiles based on the usage patterns. In such embodiments, processing block 408 generates the ranked list based on the first profile.

In some embodiments, the first frequency indicator indicates a first temporal lifetime of a first subset of the first file, and a second temporal lifetime of a second subset of the first file. The first temporal lifetime is associated with a frequency of rewrites of the first subset, and the second temporal lifetime is associated with a frequency of rewrites of the second subset. In such embodiments processing block 408 includes conducting an identification that the second temporal lifetime meets a threshold, and that the first temporal lifetime does not meet threshold, and in response to the identification, determining that the first subset is to be stored in the memory cache and that the second subset is not to be stored in the memory cache.

Figure 3:
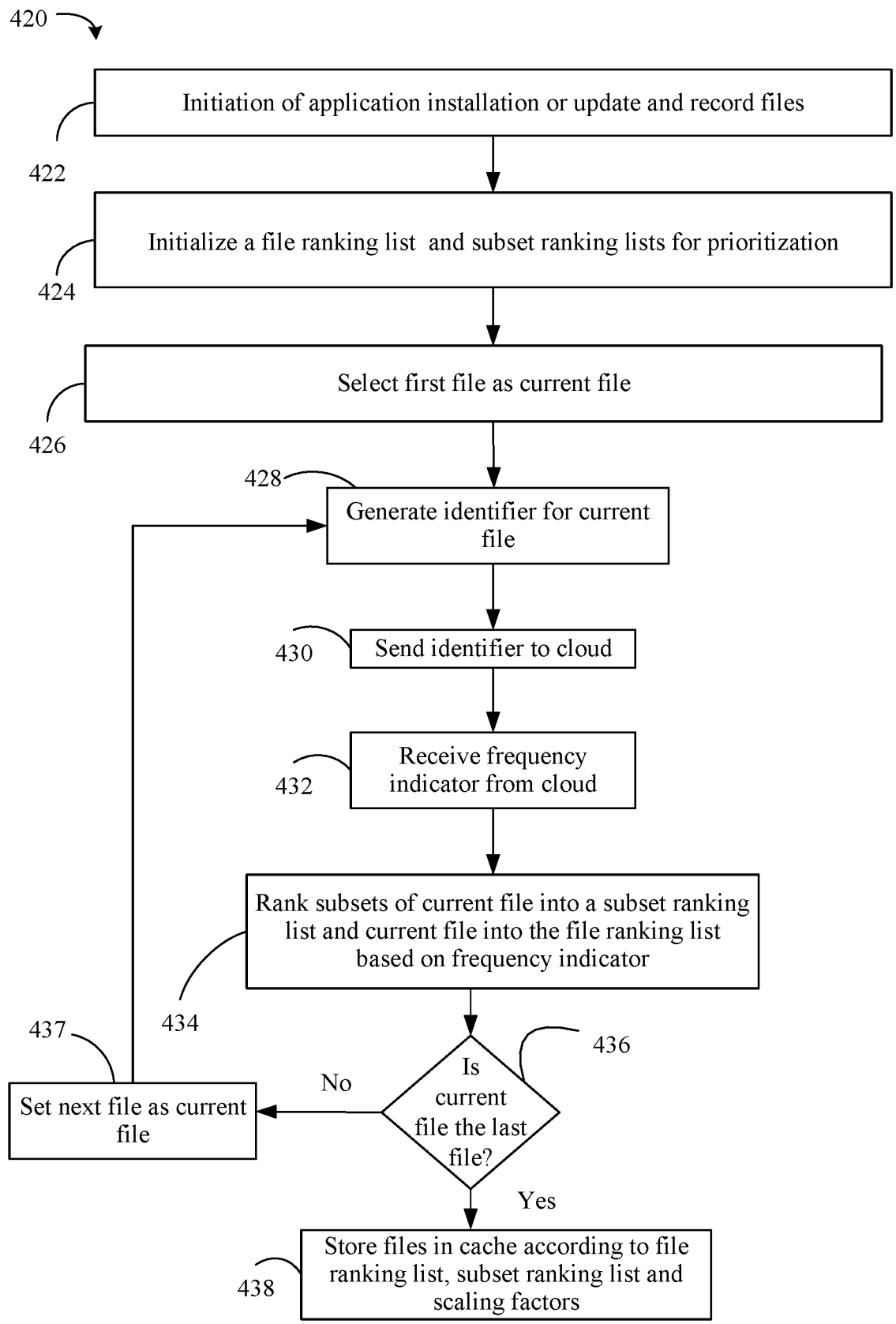
FIG. 3 is a flowchart of an example of a method of application cache management according to an embodiment.

FIG. 3 shows a method 420 of application cache management by a computing device. The method 420 may be readily operated in conjunction with process 300. More particularly, the method 420 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 422 initiates (e.g., a user initiated or application initiated) an application installation and/or application update. Illustrated processing block 422 further monitors and records a list of files installed, updated or modified as a result of the install and/or update. Illustrated processing block 424 initializes a file ranking list and a subset ranking list which are employed to prioritize the files and subsets of the files to place on the cache(s).

Illustrated processing block 426 may select a first file of the files as a current file to be analyzed. Illustrated processing block 428 generates an identifier for the current file (e.g., a lookup key). For example, illustrated processing block 428 generates a lookup key based upon the current file and contents of the current file. This lookup key may be an anonymized multibyte checksum, a cyclic redundancy check, or a normal file system error checking operation. The lookup key may be the identifier.

Illustrated processing block 430 transmits the identifier for the current file to the cloud. Illustrated processing block 432 receives a frequency indicator from the cloud. For example, the cloud may identify the frequency indicator based on the identifier, if for example an identifier (e.g., lookup key) matches the identifier of the current file. The frequency indicator is associated with the current file and is generated by the cloud from usage patterns of multiple users of the application across multiple computing devices. The frequency indicator may include one or more of access frequencies and temporal lifetimes of the current file and subsets of the current file based on data from the multiple users and the multiple computing devices. In some embodiments, the cloud may access a cloud frequency database to identify a frequency of the current file, as well as a list of top subsets and/or frequency tuples of the top subsets. Thus, in some embodiments, the frequency indicator may include less than all of the subsets of the current file, and include only the subsets that are ranked to be the most frequently accessed while excluding lesser frequently accessed subsets.

Illustrated processing block 434 may rank subsets of the current file into a subset ranking list and the current file into a file ranking list based on the received frequency indicator. For example, the subset ranking list may rank the subsets (e.g., subset tuples) in order from most frequently accessed to least frequently accessed, and the file list may rank files in order of most frequently accessed to least frequently accessed. In some embodiments, different subset ranking lists may be established so that each file has a corresponding unique subset ranking list that ranks subsets of the file. In other embodiments, a global subset ranking list may be established that stores all of the subsets of all of the files with each subset being marked as originating from a particular file. The file ranking list may be global in that all files may be sorted, ranked and stored in the file ranking list based on frequency of accesses.

Illustrated processing block 436 determines if the current file is the last file of the application. For example, illustrated processing blocks 428, 430, 432, 434, 436 and 437 may be iteratively executed until the last file and subsets of the last file are processed and placed into the subset ranking list (either global or unique subset ranking list) and the last file is placed in the file ranking list. If the current file is not the last file, illustrated processing block 437 may execute. A next file after the current file is identified, and is then set as the new current file. Processing blocks 428, 430, 432, 434, 436 then execute based on the new current file.

When illustrated processing block 436 identifies that the last file has been reached, illustrated processing block 438 stores files in the cache according to the file ranking list, the subset ranking list(s) and any applicable scaling factors. For example, illustrated processing block 438 may utilize a prioritization algorithm to store the files and blocks the cache(s). The amount of cache space dedicated to the files and subsets caches may be tunable parameters that are set in accordance with user preference and/or quality metrics. In some embodiments, the prioritization algorithm may determine the data to cache based on a ranked ordered list that is generated from the subset ranking list and the file ranking list. For example, a highest access frequency subset of each of a highest frequency group of files may be stored in the cache. For example, a highest frequency subset of a first file, a highest frequency subset of a second file, and a highest frequency subset of a third file may be stored in the cache.

In some embodiments, the prioritization algorithm may include classifying the user into an artificial intelligence (AI) derived archetype based upon currently installed applications and/or a user survey. Scaling factors may then be applied to the frequencies of access based upon the installed applications and/or the user survey. The scaling factors may therefore prioritize some types of data over others to influence which data is stored in the cache. The archetypes may be generated utilizing AI (e.g., self-organizing maps) from the cloud frequency database. The computing device may then begin normal persistent data cache operation.

Figure 4:
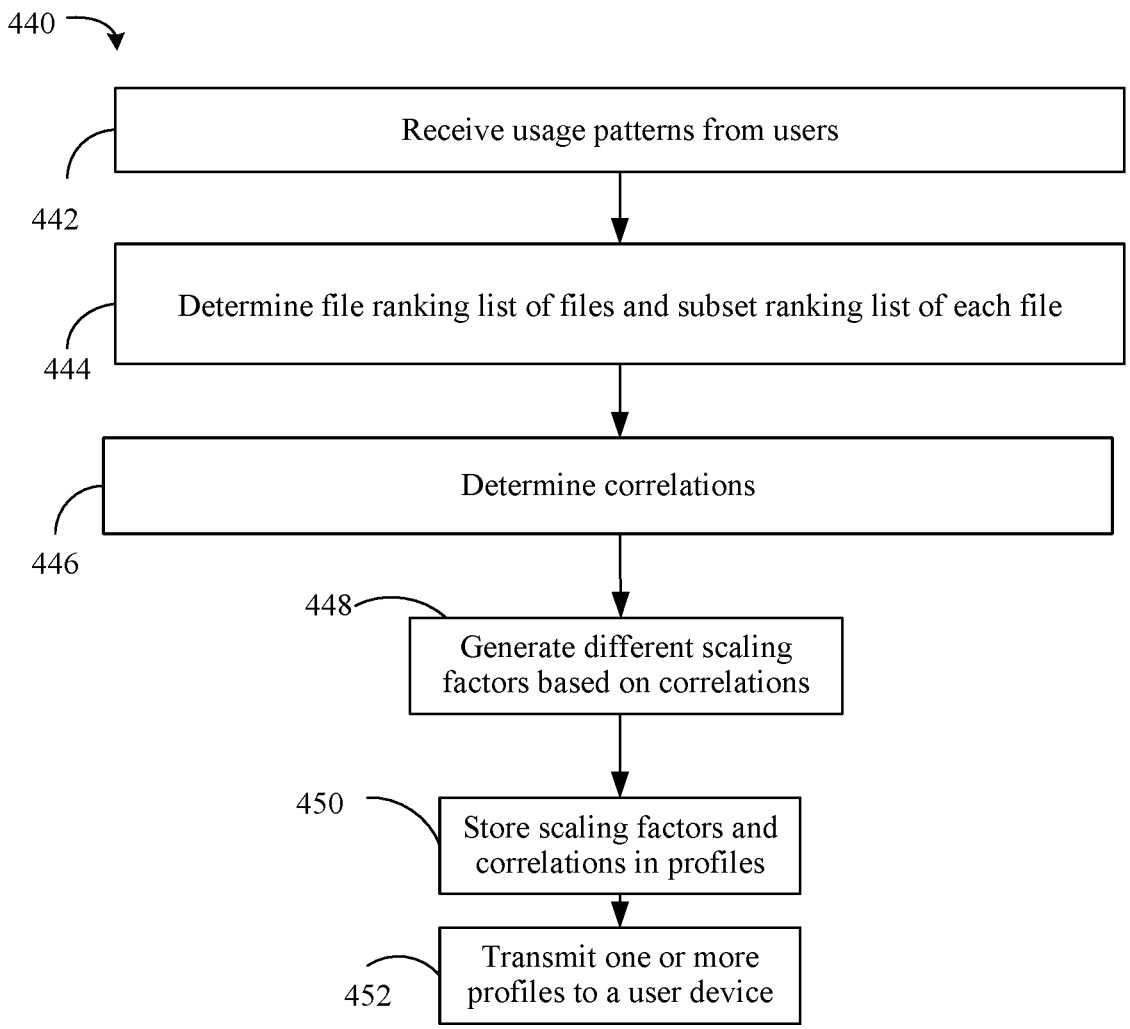
FIG. 4 is a flowchart of an example of a method of generating profiles according to an embodiment.

FIG. 4 shows a method 440 of generating profiles by a server or other cloud device. The method 440 may be readily operated in conjunction with process 300. More particularly, the method 440 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 442 receives application usage patterns from users. The usage patterns may include application accessed, a number of accesses to files of the application and subsets of the files, timestamps of the accesses and so forth. Illustrated processing block 444 determines a file ranking list of files and a subset ranking list of each file.

Illustrated processing block 446 determines correlation in usage patterns. For example, illustrated processing block 446 may determine that if a user has a usage pattern to utilize a first application in such a way to cause a first type of data (e.g., online gaming mode related data) to be frequently accessed and cached, but not a second type of data (e.g., storytelling gaming mode related data), the user may adopt a similar usage pattern with other applications (e.g., other games). Thus, a correlation may be generated between based on the applications. Illustrated processing block 446 may employ AI techniques to determine the correlations.

Illustrated processing block 448 may generate different scaling factors in association with the identified correlations. For example, the scaling factors may more heavily weigh frequencies of access to data (e.g., online gaming mode related data) that is determined to be likely to be accessed based on the correlation compared to other data (e.g., storytelling gaming mode related data).

Illustrated processing block 450 stored the scaling factors and correlation in profiles that may be accessed at a later time. Illustrated processing block 452 may transmit one or more of the profiles to a user device.

Figure 5:
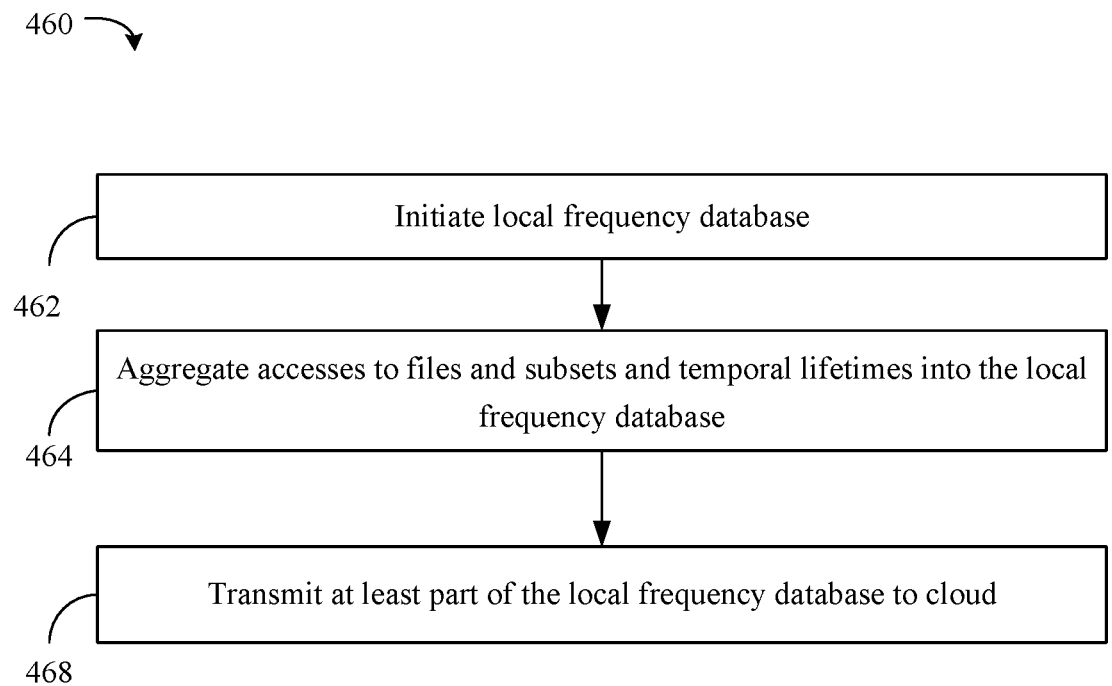
FIG. 5 is a flowchart of an example of a method storing and maintaining a local frequency database according to an embodiment.

FIG. 5 shows a method 460 of storing and maintaining a local frequency database by a user device. The method 460 may be readily operated in conjunction with process 300. More particularly, the method 460 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 462 initiates a local frequency database. Illustrated processing block 462 may execute in response to an application download and/or update. Illustrated processing block 464 aggregates accesses to files and subsets of files into the local frequency database. Illustrated processing block 464 may further record a temporal lifetime of data in the local frequency database. Illustrated processing block 468 may transmit at least a part of the local frequency database to the cloud. In some embodiments, illustrated processing block 468 may reset all counts in the local frequency database to zero after the transmission.

Figure 6:
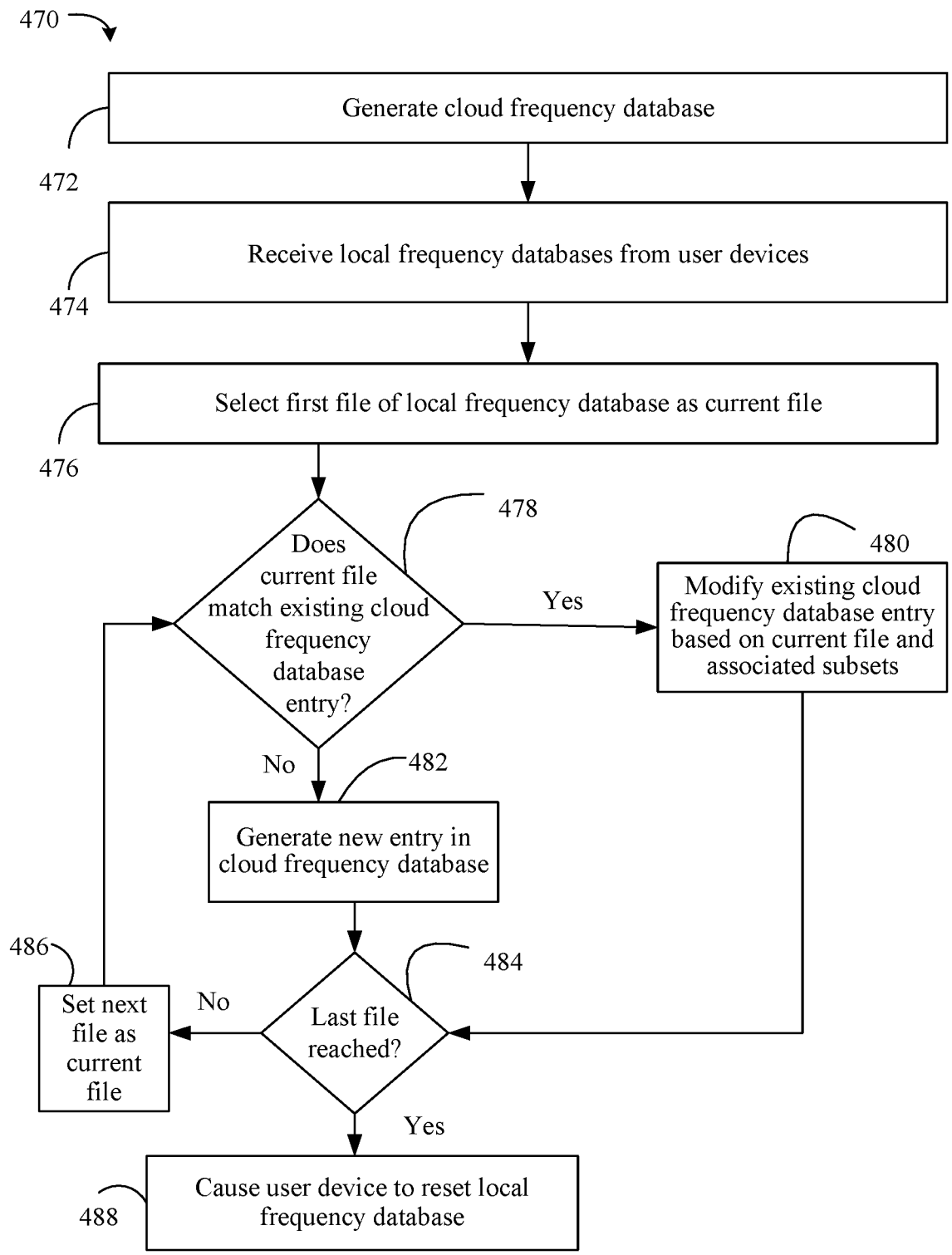
FIG. 6 is a flowchart of an example of a method cloud frequency database management according to an embodiment.

FIG. 6 shows a method 470 of cloud frequency database management by a server or other cloud device. The method 470 may be readily operated in conjunction with process 300. More particularly, the method 470 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 472 generates a cloud frequency database. For example, illustrated processing block 472 generates the cloud frequency database to include a global repository of lookup keys associated with access counts that have been aggregated from a plurality of different users. The cloud frequency database may also contain a list of subset and frequency tuples associated with the lookup keys that are also aggregated from the users. The frequency tuples may represent two specific types of accesses: 1) the number of times the data was accessed and 2) the temporal lifetime of the data which may be the relative time before the data is rewritten. Recording the temporal lifetime of the data may be beneficial because some embodiments may prioritize longer lifetime data over shorter lifetime data. That is, repeated writes to a flash-based cache and certain kinds of cache (e.g., 3D X-point) may have an impact on physical lifetime of the cache. Thus, some embodiments may choose to not cache data that is repeatedly written or to allocate physical memory with a delayed write caching strategy which may withstand the lifetime effects of repeated writes.

Illustrated processing block 474 may receive a local cloud frequency database from a user device. For example, some embodiments further include counting and recording of total accesses to each file and block that is currently cached and a local frequency database on a user system that tracks counts across the addition and subsequent removal of files and/or blocks into the various caches. The local cloud frequency database may be periodically uploaded. The cloud frequency database may be updated based upon periodic network requests from user systems that employ the above described cache management schemes.

Illustrated processing block 476 may select a first file of the local frequency database as a current file. Illustrated processing block 478 determines whether the current files matches an existing cloud frequency database entry. For example, processing block 478 determines if a lookup key of the current file of the local frequency database matches an existing lookup key of an entry of the cloud frequency database.

If so, illustrated processing block 480 modifies the existing cloud frequency database entry (that matches the current file) based on the current file. For example, illustrated processing block 480 adds the local frequency count of the current file to the cloud frequency count for that entry. In some embodiments, illustrated processing block 480 may determine whether the local frequency count is excessively high (e.g., exceeds a boundary), and reduce the local frequency count if so. For example, processing block 480 may reduce the influence of an unusually high number of accesses by a small group of users. For example, the summation of the local frequency count and the cloud frequency count may be accomplished using a weighted average according to the following Equation 1:

$$T(m+1)=T(m)+L/(m+1) \quad (1)$$

"T" is be the cloud frequency count associated with the key, "m" is the total number of all time lookups that matched the key thus far, and "L" is the local frequency count. In some embodiments, the local frequency count may be cut-off at a predetermined threshold. For example, if the local frequency count (e.g., 10) exceeds the predetermined threshold (e.g., 5) the local frequency count (e.g., 10) may be reduced to the predetermined threshold (e.g., 5) and then the reduced local frequency count (e.g., 5) is added to the to the current cloud frequency count. In some embodiments, the local frequency count may be modified through a root mean squared algorithm. Illustrated processing 480 may further add the subset and frequency tuples of the local frequency database (e.g., the subset and frequency tuples associated with the lookup key of the current file) to a cloud subset frequency database using the same operations as described above.

If processing block 478 determines that the lookup key of the current file does not match an existing entry, processing block 482 may generate a new entry in the cloud frequency database with the count set to the local frequency count. The block and frequency tuples associated with the lookup key of the current file are also copied into new entries. Illustrated processing block 484 determines whether the last file of the local frequency database is reached. If not, a next file after the current file is set as a new current file, and block 478 iterates again. Otherwise, processing block 488 causes the counts associated with all entries in the local frequency database to be reset to 0.

Figure 7:
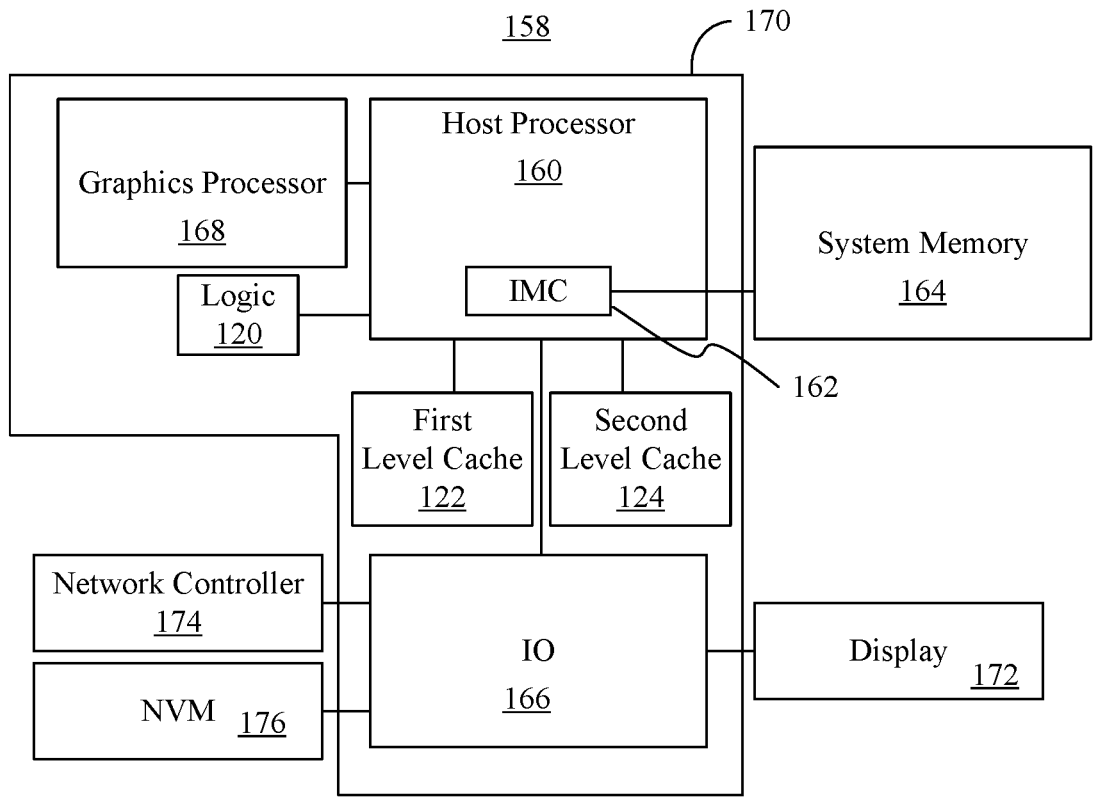
FIG. 7 is a block diagram of an example of a computing system according to an embodiment.

Turning now to FIG. 7, an efficiency-enhanced computing system 158 is shown. The computing system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), etc., or any combination thereof. In the illustrated example, the system 158 includes a host processor 160 (e.g., CPU with one or more processor cores) having an integrated memory controller (IMC) 162 that is coupled to a system memory 164 and may operate as a cache controller according to some embodiments.

The illustrated system 158 also includes a graphics processor 168 (e.g., graphics processing unit/GPU) and an input output (IO) module 166 implemented together with the processor 160 (e.g., as microcontrollers) on a semiconductor die 170 as a system on chip (SOC), where the IO module 166 may communicate with, for example, a display 172 (e.g., touch screen, liquid crystal display/LCD, light emitting diode/LED display), a network controller 174 (e.g., wired and/or wireless) that communicates with a server, and mass storage 176 (e.g., HDD, optical disc, SSD, flash memory or other NVM).

The illustrated SOC 170 includes first and second level caches 122, 124. The first and second level caches 122, 124 may be persistent media in that power is not required to maintain and store data. The SOC 170 may further include logic 120 with logic instructions that correspond to a cache controller in some embodiments, and which when executed by the host processor 160, cause the computing system 158 to perform one or more aspects of the process 300 of FIGS. 1A-1C, the method 400 of FIG. 2, the method 420 of FIG. 3, the method 420 of FIG. 3, the method 440 of FIG. 4, the method 460 of FIG. 5, the method 470 of FIG. 6 already discussed. Additionally, in some embodiments, the system memory 164 may include instructions, which when executed by the computing system 158, cause the computing system 158 to perform as a cache controller and additionally to perform one or more aspects of the process 300 of FIGS. 1A-1C, the method 400 of FIG. 2, the method 420 of FIG. 3, the method 420 of FIG. 3, the method 440 of FIG. 4, the method 460 of FIG. 5, the method 470 of FIG. 6 already discussed. Thus, the cache controller may determine whether to store data in the first level cache 122, the second level cache 124 or the system memory 164. The network controller 174 may for example receive profile data and frequency indicators from the server. The cache controller may determine whether to store application data and subsets of the application in the first level cache 122, the second level cache 124 or the system memory 164 based on the received profile data and the frequency indicators.

Accordingly, the computing system 100 may be considered to be performance enhanced in that the computing system 100 may intelligently utilize existing hardware, such first and second level caches 122, 124, to reduce execution latencies of applications and prolong the life of the first and second level caches 122, 124. For example, the computing system 100 may determine which application data to store in the first and second level caches 122, 124 based on other users usage patterns, thus bypassing an initial learning period that may be involved with other caching systems.

Figure 8:
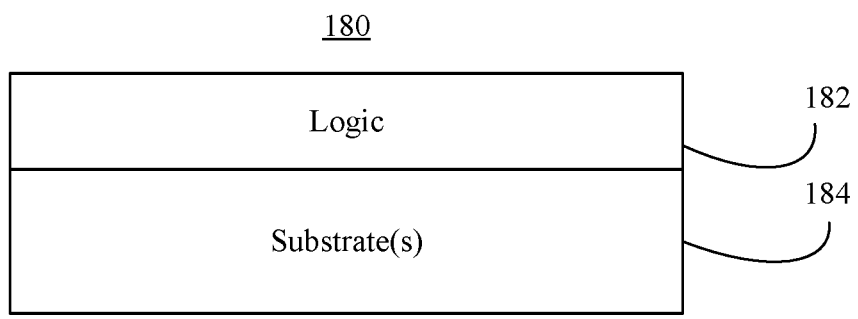
FIG. 8 is an illustration of an example of a semiconductor apparatus according to an embodiment.

FIG. 8 shows a semiconductor package apparatus 180. The illustrated apparatus 180 includes one or more substrates 184 (e.g., silicon, sapphire, gallium arsenide) and logic 182 (e.g., transistor array and other integrated circuit/IC components) coupled to the substrate(s) 184. In one example, the logic 182 is implemented at least partly in configurable logic or fixed-functionality logic hardware. The logic 182 may implement one or more aspects of the process 300 of FIGS. 1A-1C, the method 400 of FIG. 2, the method 420 of FIG. 3, the method 420 of FIG. 3, the method 440 of FIG. 4, the method 460 of FIG. 5, the method 470 of FIG. 6 already discussed, already discussed. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 9:
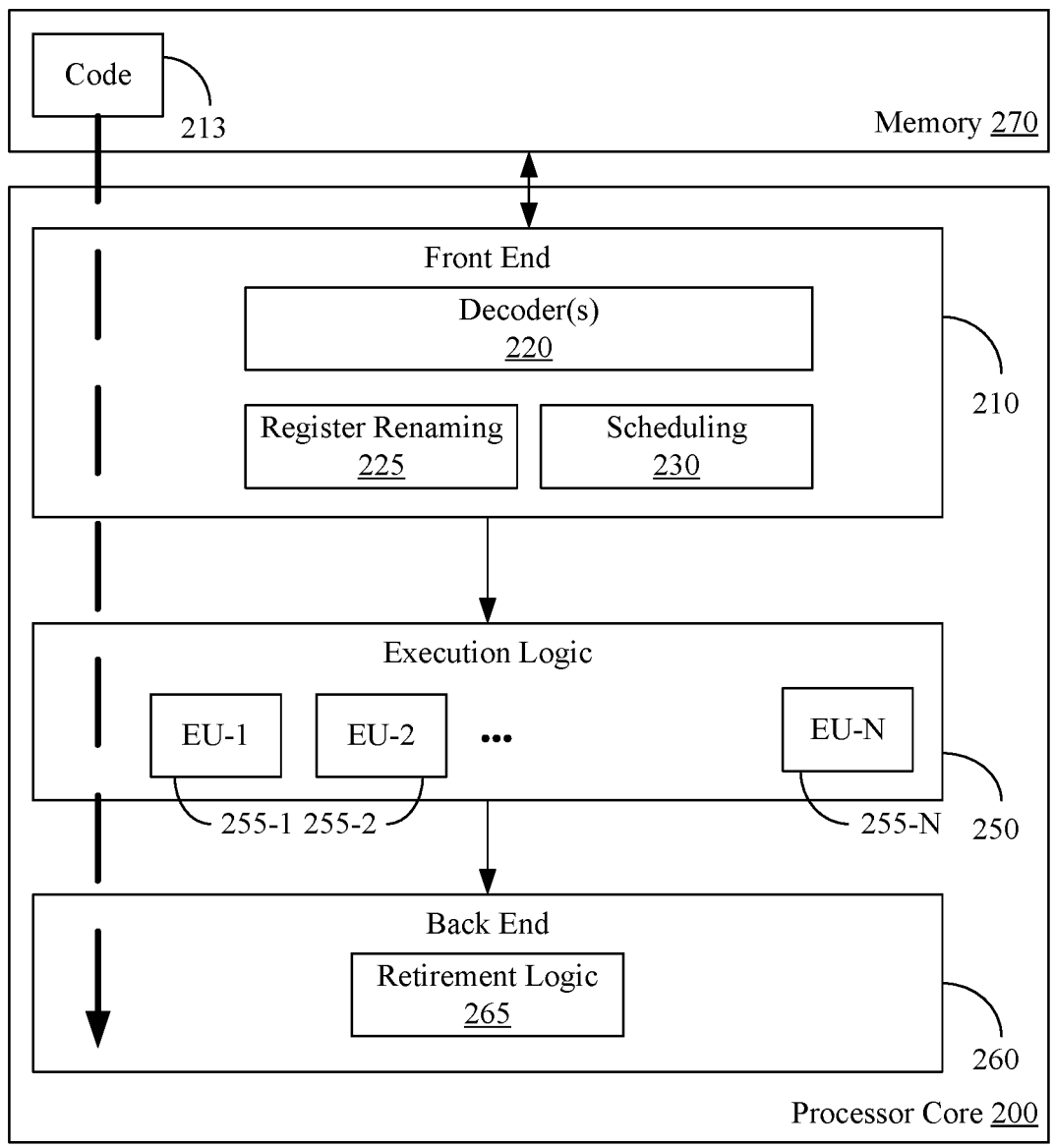
FIG. 9 is a block diagram of an example of a processor according to an embodiment.

FIG. 9 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 9, a processing element may alternatively include more than one of the processor core 200 illustrated in FIG. 9. The processor core 200 may be a single-threaded core or, for at least one embodiment, the processor core 200 may be multithreaded in that it may include more than one hardware thread context (or "logical processor") per core.

FIG. 9 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement the process 300 of FIGS. 1A-1C, the method 400 of FIG. 2, the method 420 of FIG. 3, the method 420 of FIG. 3, the method 440 of FIG. 4, the method 460 of FIG. 5, the method 470 of FIG. 6 already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 9, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 10:
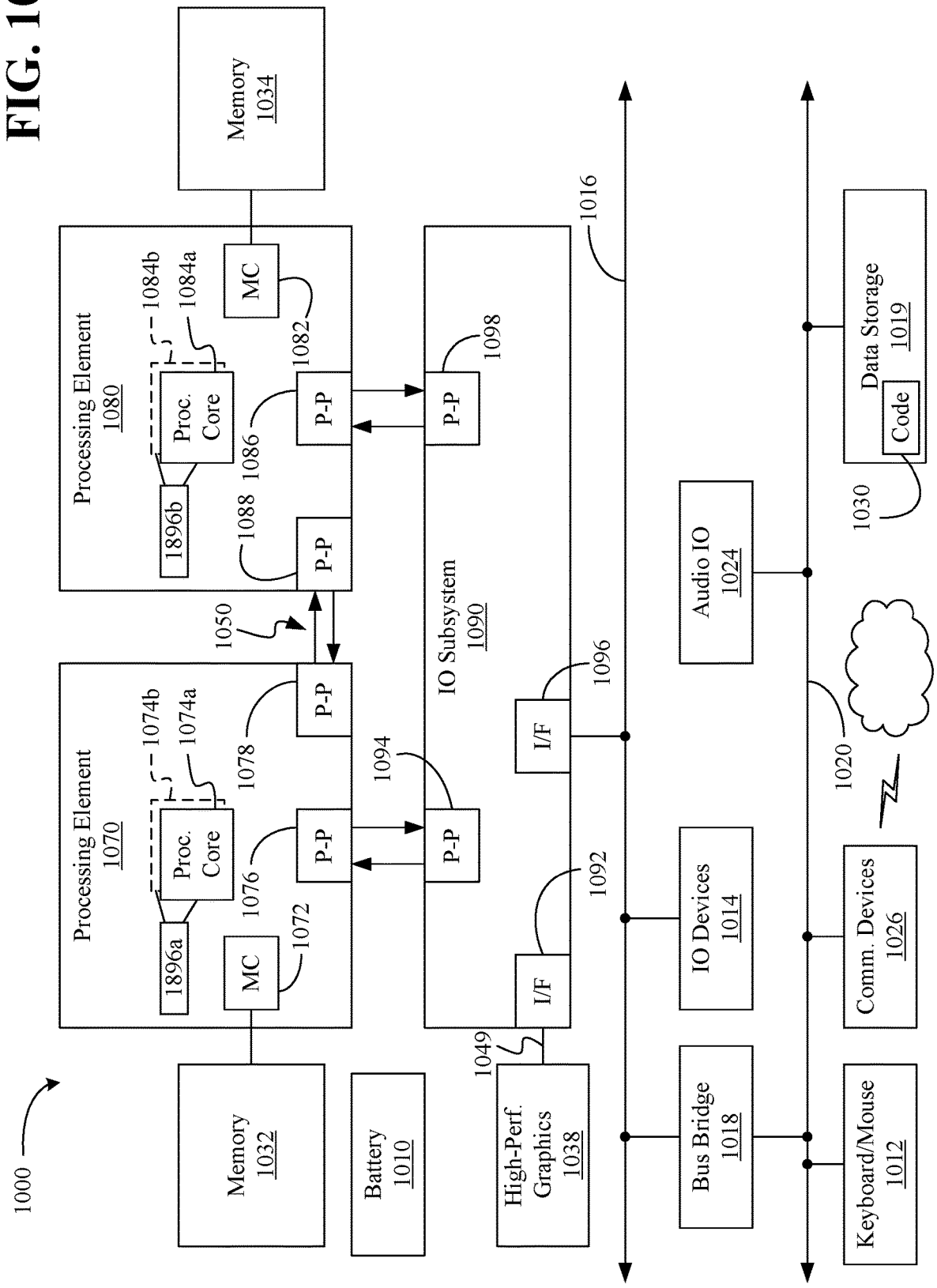
FIG. 10 is a block diagram of an example of a multi-processor based computing system according to an embodiment.

Referring now to FIG. 10, shown is a block diagram of a computing system 1000 embodiment in accordance with an embodiment. Shown in FIG. 10 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 10 may be implemented as a multi-drop bus rather than point-to-point interconnect.

As shown in FIG. 10, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 9.

Each processing element 1070, 1080 may include at least one shared cache 1896a, 1896b (e.g., 3d XPoint, disk caches, etc.). The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 10, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 10, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 10, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive, 3d XPoint, disk caches or other mass storage device which may include code 1030, in one embodiment. The illustrated code 1030 may implement the process 300 of FIGS. 1A-1C, the method 400 of FIG. 2, the method 420 of FIG. 3, the method 420 of FIG. 3, the method 440 of FIG. 4, the method 460 of FIG. 5, the method 470 of FIG. 6 already discussed. Further, an audio I/O 1024 may be coupled to second bus 1020 and a battery 1010 may supply power to the computing system 1000.

Note that other embodiments are contemplated. For example, instead of the point-to-point architecture of FIG. 10, a system may implement a multi-drop bus or another such communication topology. Also, the elements of FIG. 10 may alternatively be partitioned using more or fewer integrated chips than shown in FIG. 10.

Additional Notes and Examples:

Example 1 includes a computing device including a network controller to communicate with a server, a memory cache, a processor coupled to the network controller, and a memory coupled to the processor, the memory including a set of instructions, which when executed by the processor, cause the computing device to in response to one or more of an installation of an application or a modification to the application, generate a lookup key based on a first file that is associated with the application, determine that the lookup key is to be transmitted to the server, and determine whether to store at least a portion of the first file in the memory cache based on a first frequency indicator associated with the first file from the server.

Example 2 includes the computing device of Example 1, wherein the instructions, which when executed by the processor, cause the computing device to identify a plurality of frequency indicators associated with a plurality of files associated with the application, generate a ranked list of the plurality of files and the first file based on the plurality of frequency indicators and the first frequency indicator, and determine whether to store the at least the portion of the first file in the memory cache based on the ranked list.

Example 3 includes the computing device of Example 2, wherein the instructions, which when executed by the processor, cause the computing device to identify a first profile for a user based on usage patterns of the user, and generate the ranked list based on the first profile.

Example 4 includes the computing device of Example 3, wherein the instructions, which when executed by the processor, cause the computing device to access a plurality of profiles that are associated with different users, and identify the first profile from the plurality of profiles based on the usage patterns.

Example 5 includes the computing device of any one of Examples 1 to 4, wherein the first frequency indicator is to indicate a first temporal lifetime of a first subset of the first file, wherein the first temporal lifetime is associated with a frequency of rewrites of the first subset, and a second temporal lifetime of a second subset of the first file, wherein the second temporal lifetime is associated with a frequency of rewrites of the second subset.

Example 6 includes the computing device of Example 5, wherein the instructions, which when executed by the processor, cause the computing device to conduct an identification that the second temporal lifetime meets a threshold, and that the first temporal lifetime does not meet threshold, and in response to the identification, determine that the first subset is to be stored in the memory cache and that the second subset is not to be stored in the memory cache.

Example 7 includes a semiconductor apparatus including one or more substrates, and logic coupled to the one or more substrates, wherein the logic is implemented in one or more of configurable logic or fixed-functionality logic hardware, the logic coupled to the one or more substrates to in response to one or more of an installation of an application or a modification to the application, generate a lookup key based on a first file that is associated with the application, determine that the lookup key is to be transmitted to a server, and determine whether to store at least a portion of the first file in a memory cache based on a first frequency indicator associated with the first file from the server.

Example 8 includes the apparatus of Example 7, wherein the logic coupled to the one or more substrates is to identify a plurality of frequency indicators associated with a plurality of files associated with the application, generate a ranked list of the plurality of files and the first file based on the plurality of frequency indicators and the first frequency indicator, and determine whether to store the at least the portion of the first file in the memory cache based on the ranked list.

Example 9 includes the apparatus of Example 8, wherein the logic coupled to the one or more substrates is to identify a first profile for a user based on usage patterns of the user, and generate the ranked list based on the first profile.

Example 10 includes the apparatus of Example 9, wherein the logic coupled to the one or more substrates is to access a plurality of profiles that are associated with different users, and identify the first profile from the plurality of profiles based on the usage patterns.

Example 11 includes the apparatus of any one of Examples 7 to 10, wherein the first frequency indicator is to indicate a first temporal lifetime of a first subset of the first file, wherein the first temporal lifetime is associated with a frequency of rewrites of the first subset, and a second temporal lifetime of a second subset of the first file, wherein the second temporal lifetime is associated with a frequency of rewrites of the second sub set.

Example 12 includes the apparatus of Example 11, wherein the logic is to conduct an identification that the second temporal lifetime meets a threshold, and that the first temporal lifetime does not meet threshold, and in response to the identification, determine that the first subset is to be stored in the memory cache and that the second subset is not to be stored in the memory cache.

Example 13 includes the apparatus of Example 7, wherein the logic coupled to the one or more substrates includes transistor channel regions that are positioned within the one or more substrates.

Example 14 includes at least one computer readable storage medium including a set of instructions, which when executed by a computing device, cause the computing device to in response to one or more of an installation of an application or a modification to the application, generate a lookup key based on a first file that is associated with the application, determine that the lookup key is to be transmitted to a server, and determine whether to store at least a portion of the first file in a memory cache based on a first frequency indicator associated with the first file from the server.

Example 15 includes the at least one computer readable storage medium of Example 14, wherein the instructions, when executed, cause the computing device to identify a plurality of frequency indicators associated with a plurality of files associated with the application, generate a ranked list of the plurality of files and the first file based on the plurality of frequency indicators and the first frequency indicator, and determine whether to store the at least the portion of the first file in the memory cache based on the ranked list.

Example 16 includes the at least one computer readable storage medium of Example 15, wherein the instructions, when executed, cause the computing device to identify a first profile for a user based on usage patterns of the user, and generate the ranked list based on the first profile.

Example 17 includes the at least one computer readable storage medium of Example 16, wherein the instructions, when executed, cause the computing device to access a plurality of profiles that are associated with different users, and identify the first profile from the plurality of profiles based on the usage patterns.

Example 18 includes the at least one computer readable storage medium of any one of Examples 14 to 17, wherein the first frequency indicator is to identify a first temporal lifetime of a first subset of the first file, wherein the first temporal lifetime is associated with a frequency of rewrites of the first subset, and a second temporal lifetime of a second subset of the first file, wherein the second temporal lifetime is associated with a frequency of rewrites of the second subset.

Example 19 includes the at least one computer readable storage medium of Example 18, wherein the instructions, when executed, cause the computing device to conduct an identification that the second temporal lifetime meets a threshold, and that the first temporal lifetime does not meet threshold, and in response to the identification, determine that the first subset is to be stored in the memory cache and that the second subset is not to be stored in the memory cache.

Example 20 includes a method including in response to one or more of an installation of an application or a modification to the application, generating a lookup key based on a first file that is associated with the application, determining that the lookup key is to be transmitted to a server, and determining whether to store at least a portion of the first file in a memory cache based on a first frequency indicator associated with the first file from the server.

Example 21 includes the method of Example 20, further including receiving a plurality of frequency indicators associated with a plurality of files associated with the application, generating a ranked list of the plurality of files and the first file based on the plurality of frequency indicators and the first frequency indicator, and determining whether to store the at least the portion of the first file in the memory cache based on the ranked list.

Example 22 includes the method of Example 21, further including identifying a first profile for a user based on usage patterns of the user, and generating the ranked list based on the first profile.

Example 23 includes the method of Example 22, further including accessing a plurality of profiles that are associated with different users, and identifying the first profile from the plurality of profiles based on the usage patterns.

Example 24 includes the method of any one of Examples 20 to 23, wherein the first frequency indicator is to indicate a first temporal lifetime of a first subset of the first file, wherein the first temporal lifetime is associated with a frequency of rewrites of the first subset, and a second temporal lifetime of a second subset of the first file, wherein the second temporal lifetime is associated with a frequency of rewrites of the second sub set.

Example 25 includes the method of Example 24, further including conducting an identification that the second temporal lifetime meets a threshold, and that the first temporal lifetime does not meet threshold, and in response to the identification, determining that the first subset is to be stored in the memory cache and that the second subset is not to be stored in the memory cache.

Example 26 includes a semiconductor apparatus comprising means for in response to one or more of an installation of an application or a modification to the application, generating a lookup key based on a first file that is associated with the application, means for determining that the lookup key is to be transmitted to a server, and means for determining whether to store at least a portion of the first file in a memory cache based on a first frequency indicator associated with the first file from the server.

Example 27 includes the apparatus of Example 26, further including means for receiving a plurality of frequency indicators associated with a plurality of files associated with the application, means for generating a ranked list of the plurality of files and the first file based on the plurality of frequency indicators and the first frequency indicator, and means for determining whether to store the at least the portion of the first file in the memory cache based on the ranked list.

Example 28 includes the apparatus of Example 27, further including means for identifying a first profile for a user based on usage patterns of the user, and means for generating the ranked list based on the first profile.

Example 29 includes the apparatus of claim 28, further including means for accessing a plurality of profiles that are associated with different users, and means for identifying the first profile from the plurality of profiles based on the usage patterns.

Example 30 includes the apparatus of any one of Examples 26 to 29, wherein the first frequency indicator is to indicate a first temporal lifetime of a first subset of the first file, wherein the first temporal lifetime is associated with a frequency of rewrites of the first subset, and a second temporal lifetime of a second subset of the first file, wherein the second temporal lifetime is associated with a frequency of rewrites of the second sub set.

Example 31 includes the apparatus of Example 30, further including means for conducting an identification that the second temporal lifetime meets a threshold, and that the first temporal lifetime does not meet threshold, and in response to the identification, means for determining that the first subset is to be stored in the memory cache and that the second subset is not to be stored in the memory cache.

Thus, technology described herein may support seamless integration of new applications into computing devices through enhanced cache utilization. The technology may reduce latency of new applications, particularly directly after a new install or update.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SOCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the computing system within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:
1. A computing device comprising:
a network controller to communicate with a server;
a memory cache;
a processor coupled to the network controller; and
a memory coupled to the processor, the memory including a set of instructions, which when executed by the processor, cause the computing device to:
in response to one or more of an installation of an application or a modification to the application, generate a lookup key based on a first file that is associated with the application;
determine that the lookup key is to be transmitted to the server; and
determine whether to store at least a portion of the first file in the memory cache based on a first frequency indicator associated with the first file from the server.

2. The computing device of claim 1, wherein the instructions, which when executed by the processor, cause the computing device to:
identify a plurality of frequency indicators associated with a plurality of files associated with the application;
generate a ranked list of the plurality of files and the first file based on the plurality of frequency indicators and the first frequency indicator; and
determine whether to store the at least the portion of the first file in the memory cache based on the ranked list.

3. The computing device of claim 2, wherein the instructions, which when executed by the processor, cause the computing device to:
identify a first profile for a user based on usage patterns of the user; and
generate the ranked list based on the first profile.

4. The computing device of claim 3, wherein the instructions, which when executed by the processor, cause the computing device to:
access a plurality of profiles that are associated with different users; and
identify the first profile from the plurality of profiles based on the usage patterns.

5. The computing device of claim 1, wherein the first frequency indicator is to indicate:
a first temporal lifetime of a first subset of the first file, wherein the first temporal lifetime is associated with a frequency of rewrites of the first subset; and
a second temporal lifetime of a second subset of the first file, wherein the second temporal lifetime is associated with a frequency of rewrites of the second subset.

6. The computing device of claim 5, wherein the instructions, which when executed by the processor, cause the computing device to:
conduct an identification that the second temporal lifetime meets a threshold, and that the first temporal lifetime does not meet threshold; and
in response to the identification, determine that the first subset is to be stored in the memory cache and that the second subset is not to be stored in the memory cache.

7. A semiconductor apparatus comprising:
one or more substrates; and
logic coupled to the one or more substrates, wherein the logic is implemented in one or more of configurable logic or fixed-functionality logic hardware, the logic coupled to the one or more substrates to:

in response to one or more of an installation of an application or a modification to the application, generate a lookup key based on a first file that is associated with the application;
determine that the lookup key is to be transmitted to a server; and
determine whether to store at least a portion of the first file in a memory cache based on a first frequency indicator associated with the first file from the server.

8. The apparatus of claim 7, wherein the logic coupled to the one or more substrates is to:
identify a plurality of frequency indicators associated with a plurality of files associated with the application;
generate a ranked list of the plurality of files and the first file based on the plurality of frequency indicators and the first frequency indicator; and
determine whether to store the at least the portion of the first file in the memory cache based on the ranked list.

9. The apparatus of claim 8, wherein the logic coupled to the one or more substrates is to:
identify a first profile for a user based on usage patterns of the user; and
generate the ranked list based on the first profile.

10. The apparatus of claim 9, wherein the logic coupled to the one or more substrates is to:
access a plurality of profiles that are associated with different users; and
identify the first profile from the plurality of profiles based on the usage patterns.

11. The apparatus of claim 7, wherein the first frequency indicator is to indicate:
a first temporal lifetime of a first subset of the first file, wherein the first temporal lifetime is associated with a frequency of rewrites of the first subset; and
a second temporal lifetime of a second subset of the first file, wherein the second temporal lifetime is associated with a frequency of rewrites of the second subset.

12. The apparatus of claim 11, wherein the logic is to:
conduct an identification that the second temporal lifetime meets a threshold, and that the first temporal lifetime does not meet threshold; and
in response to the identification, determine that the first subset is to be stored in the memory cache and that the second subset is not to be stored in the memory cache.

13. The apparatus of claim 7, wherein the logic coupled to the one or more substrates includes transistor channel regions that are positioned within the one or more substrates.

14. At least one non-transitory computer readable storage medium comprising a set of instructions, which when executed by a computing device, cause the computing device to:
in response to one or more of an installation of an application or a modification to the application, generate a lookup key based on a first file that is associated with the application;
determine that the lookup key is to be transmitted to a server; and
determine whether to store at least a portion of the first file in a memory cache based on a first frequency indicator associated with the first file from the server.

15. The at least one non-transitory computer readable storage medium of claim 14, wherein the instructions, when executed, cause the computing device to:
identify a plurality of frequency indicators associated with a plurality of files associated with the application;
generate a ranked list of the plurality of files and the first file based on the plurality of frequency indicators and the first frequency indicator; and
determine whether to store the at least the portion of the first file in the memory cache based on the ranked list.

16. The at least one non-transitory computer readable storage medium of claim 15, wherein the instructions, when executed, cause the computing device to:
identify a first profile for a user based on usage patterns of the user; and
generate the ranked list based on the first profile.

17. The at least one non-transitory computer readable storage medium of claim 16, wherein the instructions, when executed, cause the computing device to:
access a plurality of profiles that are associated with different users; and
identify the first profile from the plurality of profiles based on the usage patterns.

18. The at least one non-transitory computer readable storage medium of claim 14, wherein the first frequency indicator is to identify:
a first temporal lifetime of a first subset of the first file, wherein the first temporal lifetime is associated with a frequency of rewrites of the first subset; and
a second temporal lifetime of a second subset of the first file, wherein the second temporal lifetime is associated with a frequency of rewrites of the second subset.

19. The at least one non-transitory computer readable storage medium of claim 18, wherein the instructions, when executed, cause the computing device to:
conduct an identification that the second temporal lifetime meets a threshold, and that the first temporal lifetime does not meet threshold; and
in response to the identification, determine that the first subset is to be stored in the memory cache and that the second subset is not to be stored in the memory cache.

20. A method comprising:
in response to one or more of an installation of an application or a modification to the application, generating a lookup key based on a first file that is associated with the application;
determining that the lookup key is to be transmitted to a server; and
determining whether to store at least a portion of the first file in a memory cache based on a first frequency indicator associated with the first file from the server.

21. The method of claim 20, further comprising:
receiving a plurality of frequency indicators associated with a plurality of files associated with the application;
generating a ranked list of the plurality of files and the first file based on the plurality of frequency indicators and the first frequency indicator; and
determining whether to store the at least the portion of the first file in the memory cache based on the ranked list.

22. The method of claim 21, further comprising:
identifying a first profile for a user based on usage patterns of the user; and
generating the ranked list based on the first profile.

23. The method of claim 22, further comprising:
accessing a plurality of profiles that are associated with different users; and
identifying the first profile from the plurality of profiles based on the usage patterns.

24. The method of claim 20, wherein the first frequency indicator is to indicate:

a first temporal lifetime of a first subset of the first file, wherein the first temporal lifetime is associated with a frequency of rewrites of the first subset; and a second temporal lifetime of a second subset of the first file, wherein the second temporal lifetime is associated with a frequency of rewrites of the second subset.

25. The method of claim 24, further comprising:

conducting an identification that the second temporal lifetime meets a threshold, and that the first temporal lifetime does not meet threshold; and in response to the identification, determining that the first subset is to be stored in the memory cache and that the second subset is not to be stored in the memory cache.

* * * * *